Figure 1:
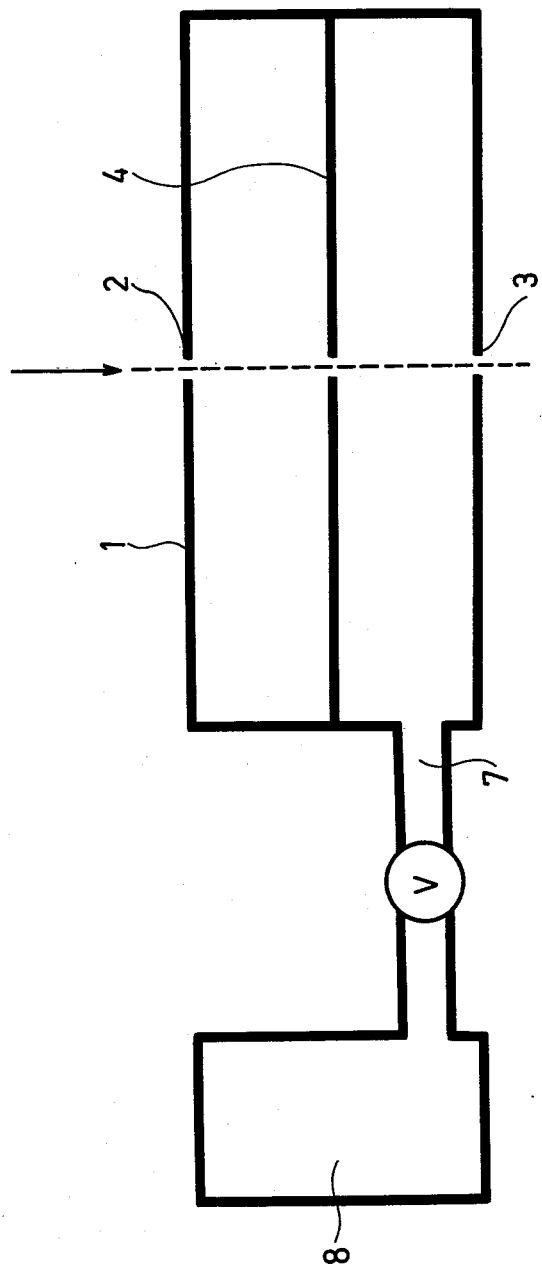

United States Patent [19]

Kalman et al.

[11] 4,071,766

[45] Jan. 31, 1978

[54] MICRO-CHAMBER FOR ELECTRON OPTICAL EXAMINATIONS PARTICULARLY FOR THE ELECTRON MICROSCOPIC EXAMINATION OF BIOLOGICAL OBJECTS

[75] Inventors: Erika Kalman; Lajos Haklik; Anna Eke; Pál Kovács, all of Budapest, Hungary

[73] Assignee: MTA Kozponti Kemiai Kutato Intezet, Budapest, Hungary

[21] Appl. No.: 683,832

[22] Filed: May 6, 1976

Related U.S. Application Data

[63] Continuation of Ser. No. 559,709, March 19, 1975, abandoned.

[30] Foreign Application Priority Data

Mar. 28, 1974 Hungary .............................. MA 2555

[51] Int. Cl.² ........................ G01N 21/00; G21K 5/06
[52] U.S. Cl. .................................... 250/443; 250/440
[58] Field of Search ..................... 250/440, 443, 439

[56] References Cited

U.S. PATENT DOCUMENTS

| | | | |
|---|---|---|---|
| 2,753,458 | 7/1956 | Kazato et al. | 250/440 |
| 2,858,444 | 10/1958 | Leisegang | 250/443 |

FOREIGN PATENT DOCUMENTS 8,955,543  6/1943  France .................................. 250/440

*Primary Examiner*—Alfred E. Smith
*Assistant Examiner*—T. N. Grigsby
*Attorney, Agent, or Firm*—Young & Thompson

[57] ABSTRACT

The invention relates to a micro-chamber for electron optical examinations, particularly for the in vitro and in vivo examinations of biologically active substances. The micro-chamber according to the invention comprises a casing provided with at least one entrance bore and optionally one or more exit bores, a specimen holder located in said casing, and a pressure-balancing buffer system attached to the micro-chamber.

4 Claims, 4 Drawing Figures

MICRO-CHAMBER FOR ELECTRON OPTICAL EXAMINATIONS PARTICULARLY FOR THE ELECTRON MICROSCOPIC EXAMINATION OF BIOLOGICAL OBJECTS

This is a continuation of application Ser. No. 559,709 filed Mar. 19, 1975 and now abandoned.

This invention relates to a micro-chamber for electron optical examinations. The micro-chamber according to the invention can be used particularly for the electron microscopic examination of biological objects either under in vitro or under in vivo conditions, furthermore for the examination of deep-frozen tissues.

Electron microscope is a particularly suitable tool for microscopic examinations, since it gives a very good resolution even at high magnification exceeding the limiting magnification of ordinary microscopes by a factor of about 1500. At present, however, biological objects can be investigated in electron microscopes only after tedious preparation operations, in non-living and disrupted state. The depth of field of the electron microscopic image is very high, and thus, unlike with the ordinary microscopes of high resolution, not only those parts of the specimen are sharp on which the electron microscope is focused, but also those that are above or below the plane of focus.

Since the introduction of electron microscope the electron microscopic investigation of living substances is an ever returning problem, because in this way biology and medical sciences could gain all-important information e.g. a more accurate knowledge of viruses, the photographic recording of their motion, diagnostics, etc.

Owing to the extremely low pressure in the order of $10^{-4}$ torr inside electron microscopes, it is impossible to maintain even approximately physiological conditions for the specimen which is in direct contact with the evacuated space. Thus in investigations of biological objects under physiological conditions only closed specimen holders have so far been employed, in which the biological object under study was located between two thin windows which cause as little disturbance as possible in the electron microscopic observation. Since windows thinner than about 300 to 400 Angstroms do not, or hardly resist the sucking effect of the high vacuum maintained in the electron microscope, and in the generally used electron microscopes with an accelerating potential of 50 to 100 kV layers of at most 1000 Angstroms in thickness can be investigated which, taking into account the closing window of 300 A in thickness, corresponds to a specimen thickness of at most 400 A, attempts have been made to increase the accelerating potential. Although in the electron microscopes with accelerating potentials of about 1000 to 3000 kV, necessary to illuminate thicker samples, the investigation of physiological samples may, in principle be performed in closed system, these electron microscopes are extremely complicated in design and very expensive, their operation is difficult, and moreover the specimen may be impaired during the investigation owing to the high acclerating voltage. It is a further disadvantage that in case of a break-down caused by contaminations occurring if the window breaks, the repair work requires complicated instruments and skilled professionals. Allinson, O.L.: Septiema Congres International de Microscopie Electronique, Grenoble (1970), 169; Fukami A., Etoh T., Ishihara, N., Katoh, M. and Fujiware, K.: Septieme Congres International de Microscopie Electronique, Grenoble (1970), 171; Heide, H. G.: J. Cell. Biol. 13, 147 (1962); Stoyanova, I. G. and Mikhalovski, G. A.: Biophysics SU, 4, 483 (1959); Dupouy, G., Perrier, F., Durrieu, L.: Compt. Rend. 251, 2836 (1960); Hale, K. F., Brown, H. and Allinson, O. L.: Septieme Congres International de Microscopie Electronique, Grenoble (1970), 297.

There have been attempts to use windowless, i.e. open systems, but they have not led to satisfactory results. The problem of continuous sample introduction could not be solved, not to mention the optional intorduction of biological reagents. As a further disadvantage, in the absence of a buffer-system the relatively big drop of sample, once introduced into the path of the electron beam, immediately bursts into pieces or evaporates when it contacts the evacuated space, and thus the sample becomes impossible to study after a quite short time, i.e., several seconds. Parson, D. F. and Moretz, R. C.: Septieme Congres International de Microscopie Electronique, Grenoble (1970), 497; Ward, P. R. and Mitchell, R. F.: Proc. 25th Anniversary Meeting of EMAG, Institute of Physics, London (1971).

The satisfactory electron microscopic investigation of deep-frozen tissue samples is so far also an unsolved problem. Although there are certain means for sectioning deep-frozen tissue samples of sizes about 1000 A in thickness necessary in electron microscopic investigations, such for instance as the "Cyro" ultramicrotome of the firms LKB (Stockholm, Sweden) and Reichert Austria, the resulting thin foils lose their water content immediately in the high vacuum when placed into the electron microscope, thus becoming impossible to study. These tissues are, therefore, placed into the electron microscope after heating and preparation, in dry state. Upon the lengthy and complicated operations the tissues, at least in part, get disrupted, and thus the image of such specimen does not give accurate information Bernard, W. and Leduc, H. E.: J. Cell. Biol. 34, 757 (1967).

The micro-chamber according to the invention eliminates the disadvantages of the hitherto known devices, and provide a simple possibility for the investigation of biological objects under nearly physiological conditions. The use of this micro-chamber enables furthermore the direct electron microscopic investigation of deep-frozen tissue samples, requiring no preparation and similar problematic steps. Since the object under study in the micro-chamber is in a direct communication with the evacuated space through the bores transmitting the electron beam, the sucking effect of the high vacuum must be compensated. This role is played in the micro-chamber according to the invention by a pressure-balancing buffer system. The use of this buffer system provides on one hand nearly physiological conditions, and on the other hand the rapid bursting or deterioration due to the loss of humidity in the sample can be avoided.

Other features and advantages of the present invention will become apparent from a consideration of the following description, taken in connection with the accompanying drawings, which illustrate respectively four different embodiments of micro-chamber according to the present invention.

The design and operation principle of a first embodiment of micro-chamber according to the invention is given with reference to FIG. 1.

The micro-chamber shown in FIG. 1 consists of casing 1 provided with entrance bore 2 and exit bore 3 in co-axial position, or in a position adjustable into co-axial relationship by centering, specimen holder 4 located in casing 1, and pressure-balancing buffer system 8, attached to the micro-chamber.

The micro-chamber shown in FIG. 1 can be applied to investigate, besides biological objects of deep-frozen tissues, any kinds of objects in the investigation of which the compensation of evacuated space is indispensable or advantageous for any reason. Since a special design of the micro-chamber according to the invention also enables one to introduce continuously the sample and or reagent, it can be utilized to advantage in studying physico-chemical, chemical or biochemical reactions as well. Considering that the most important field of application of the micro-chamber according to the invention appears to be the investigation of biological objects, the micro-chamber will be described below in terms of its biological applications, noting, however, that our invention is not limited to this field of application.

Pressure controlling buffer system 8, as given in FIG. 1, and attached to the micro-chamber via tube 7, may be a tank containing a liquid. From the tank vapour, or optionally a liquid, passes through tube 7 into the micro-chamber, which liquid or vapour compensates the evaportion of the sample and the effect of the evacuated space exerted on the specimen through the entrance and exit bores or openings i.e. maintains a pressure in the environment of the specimen that is necessary for the physiological conditions, and at the same time ensures the conditions, e.g. the moist atmosphere, for the life of the specimen. The tank is filled with a liquid that has no adverse effect on the specimen, and does not interfere with the optionally performed biological reactions. The liquid is preferably water. If desired, a reagent; causing a reaction when contacted with the specimen can also be stored in the tank. Such reagents may be for instance contrast-substances.

Pressure-controlling buffer system 8 may also be a gas tank equipped with an appropriate pressure controlling device, such as a needle valve, or a tube-end connected to the gas space. This design is advantageous primarily in the investigation of deep-frozen samples, when only a compensation of pressure is necessary, and moist atmosphere need not be provided for. If desired, reagent may also be sprinkled onto the specimen together with the gas, as above.

The two co-axial openings, or openings adjustable by centering into co-axial position, through which the electron beam passes, are preferably identical in diameter, or different by at most one order. The diameter is preferably 30 to 100 microns, but, if required, higher or lower diameters can also be used. If the casing of the micro-chamber is made of one piece of material, entrance bore 2 and exit bore 3 must be co-axial. The casing of the micro-chamber can, however, be manufactured from two removable pieces, and in this case entrance bore 2 on the upper part and exit bore 3 on the lower part must be adjusted into co-axial position before the measurement.

The specimen holder may be a device that transmits the electron beam, such as a sieve plate, grid or a plate equipped with a hole. In the latter case a film specimen is spanned across this hole.

Figure 2:
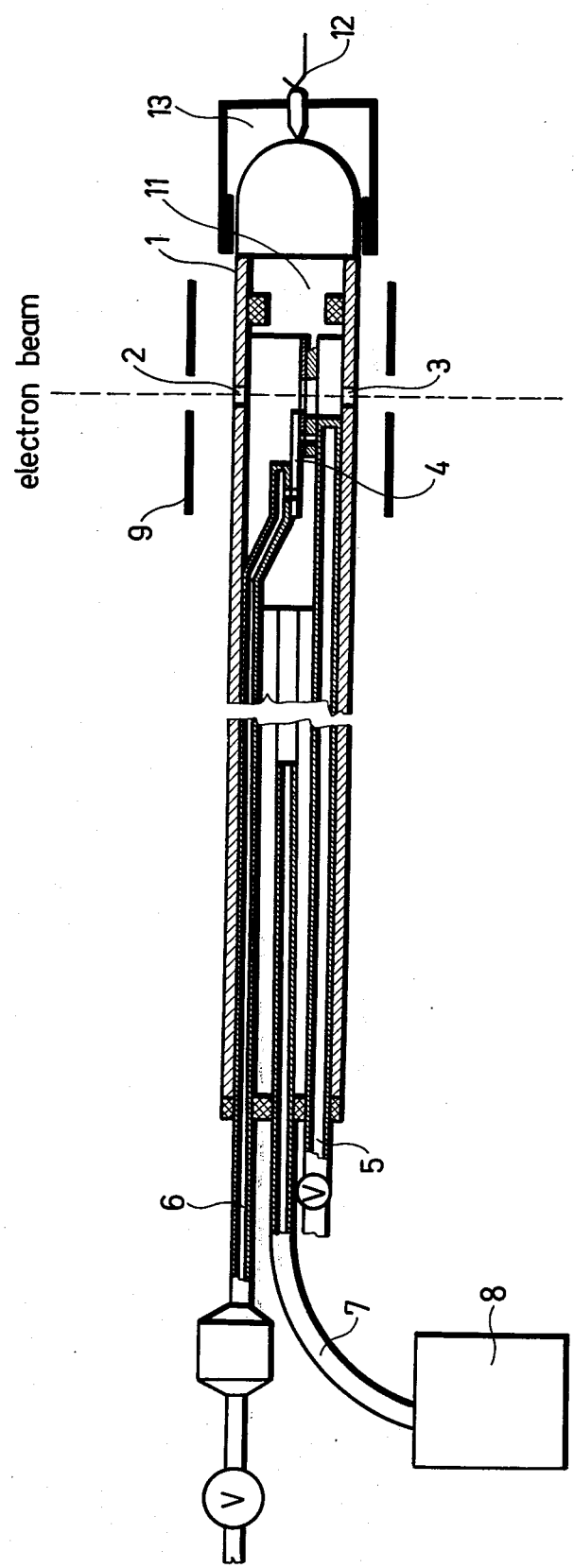

The micro-chamber shown in FIG. 2 is a special embodiment of the micro-chamber given in FIG. 1 that can be used primarily in "in vitro" studies on liquid biological objects.

The micro-chamber shown in FIG. 2 consists of casing 1 provided with entrance bore 2 and exit bore 3 in co-axial position or in a position adjustable into co-axial relationship by centering, specimen holder 4 located in casing 1, tubing 5 to introduce the object under study, smearing device 6 equipped optionally with a wiper, and pressure balancing buffer system 8, communicating with the micro-chamber through tube 7. Specimen holder 4 is fastened preferably with closing element 11.

During the measurement the object to be investigated is introduced onto specimen holder 4 through tubing 5, it is spread on the specimen holder by means of smearing device 6 equipped optionally with a wiper, and simultaneously vapour, liquid or gas is introduced into the system by means of pressure-balancing buffer system 8. The buffer system compensates the pressure drop, and, with the application of liquids, ensures the physiological moist atmosphere.

According to an advantageous design, smearing device 6 provided with a wiper is shaped in the form of a reagent inlet tube, and simultaneously with spreading the specimen, a reagent chemical or biological, including contrast substances as well is transferred onto the sample. This provides a possibility for the investigation of chemical, physico- and bio-chemical reactions. As in the micro-chamber according to the invention the biological reactions can be studied under physiological conditions, the mechanism of the biological effects of biologically active substances can also be investigated.

The micro-chamber may be equipped preferably with temperature regulator 13, by which the temperature of the system can be controlled during the investigations. The temperature of the sample can be measured with sensor 12. With an appropriate cooling medium such as liquid nitrogen, temperature regulator 13 can also be used to freeze abruptly the specimen (e.g. liquid film) in the specimen holder. By this operation certain elements of the biological object, for instance the tissues under study, can be fixed in a given position without causing damage. Temperature regulator 13 is preferably located on the side facing the inlet of the specimen.

If desired, the micro-chamber can be surrounded in part or completely with protecting jacket 9 filled with liquid nitrogen or an other substance providing deep freezing. This protecting jacket prevents, by deep freezing, the object under study from getting into the electron microscope or its environment. Besides this protection against contamination, protecting jacket 9 also enables the pressure around the micro-chamber to be maintained at the possible lowest value. In order to maintain the high vacuum, an auxiliary pump must also be connected to the electron microscopes of conventional design.

Figure 3:
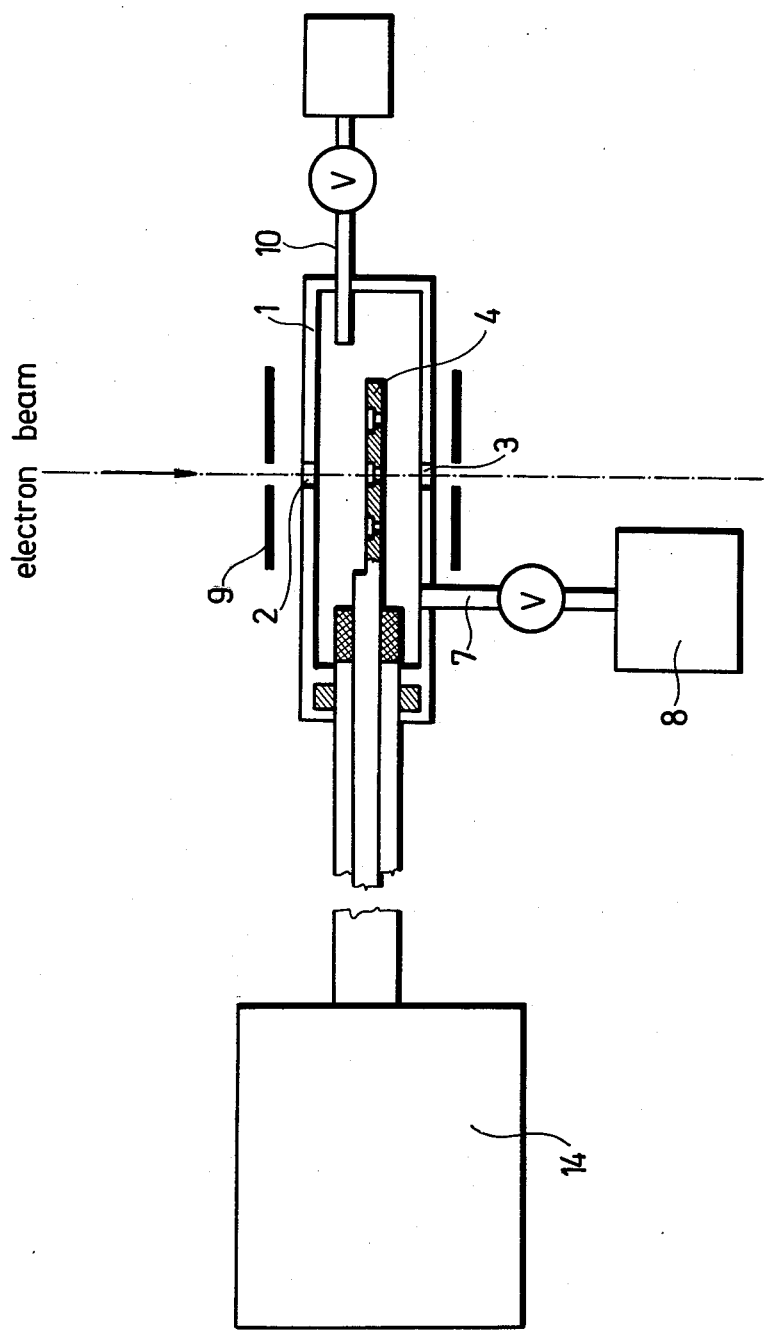

An embodiment of the micro-chamber given in FIG. 1, applicable especially in the investigation of deep-frozen tissue samples, is shown in FIG. 3.

The micro-chamber of FIG. 3 consists of casing 1 provided with entrance bore 2 and exit bore 3 in co-axial position, or in a position adjustable into co-axial relationship by centering, specimen holder 4 located in casing 1, and pressure-balancing buffer system 8, communicating with the micro-chamber preferably via tube 7. In the investigation of deep-frozen tissue samples cooling tank 14 is attached to specimen holder 4. In certain cases, for instance when less volatile substances are investigated, it is not necessary to attach cooling tank 14 to specimen holder 4 of the micro-chamber shown in FIG. 3.

Specimen holder 4 may be a device known per se, for instance a Phillips type specimen holder rod.

According to a preferable embodiment, a reagent, optionally contrast-material, is evaporated onto the specimen in the micro-chamber through tube 10.

If desired, the micro-chamber may be surrounded in part or completely with protecting jacket 9 filled with liquid nitrogen or other substance ensuring deep freezing. The role of protecting jacket 9 is the same as given in connection with the micro-chamber of FIG. 2. In order to maintain high vacuum, an auxiliary pump must be attached to the electron microscope of conventional design in this case as well.

Figure 4:
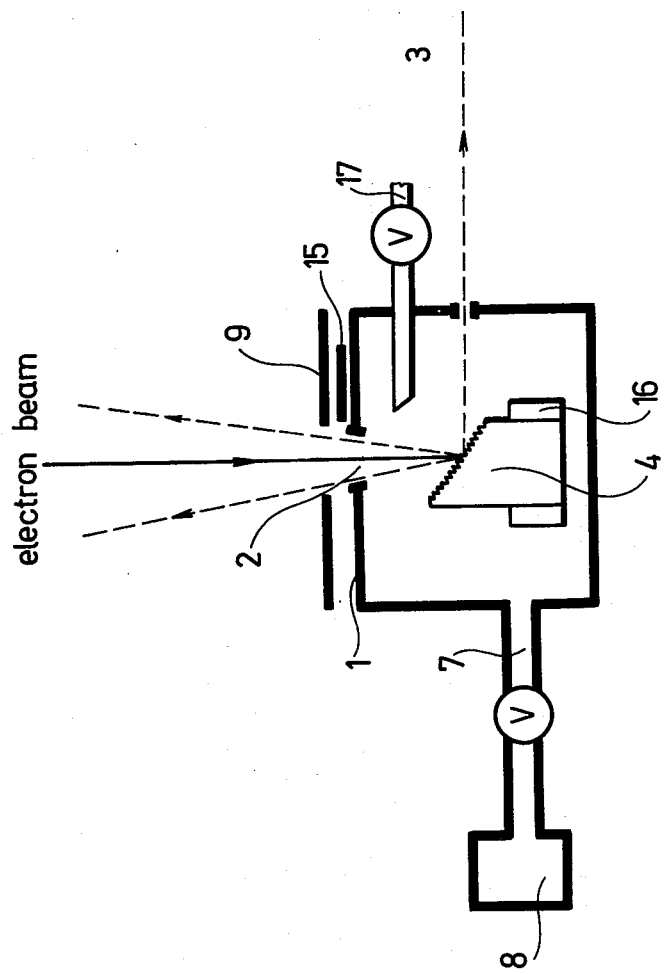

An embodiment of the micro-chamber given in FIG. 1 adapted to the electron-optical investigation of the surface structure of the specimen is shown in FIG. 4. This micro-chamber differs from the one shown in FIG. 1 essentially only in the arrangement of bores. In casing 1 of the micro-chamber shown in FIG. 4 there is at least one entrance bore 2 in the path of the electron beam. The electron beam entering entrance bore 2 is reflected by the specimen located on specimen holder 4, and leaves the chamber via entrance bore 2, where it can be detected. If desired, the beam can be detected at other points as well, in this case an arbitrary number of exit bores 3 can be formed at arbitrary points of casing 1, where the reflected electron beam is detected.

Also in this design, pressure controlling buffer system 8 is attached to the micro-chamber through tube-end 7, the design of which is the same as given above. The opening (s) in casing 1 can, if desired, be closed with closing element 15, but this closing element need not always be applied. If desired, the micro-chamber can be surrounded in part or completely by protecting jacket 9, identical to the one described above. Through tube 17 reagent can be transferred into the micro-chamber, if desired. According to an advantageous embodiment, a temperature control element as in FIG. 3 can be attached to specimen holder 4, by means of which the temperature of the specimen can be maintained at a desired value.

In the conventional electron optical instruments the specimen is located in the high vacuum. The application of buffer system 8 enables one to investigate the environment, and thus also the surface of the specimen, under special conditions in the chamber according to the invention. Moreover, at a given temperature and pressure reagents can be transferred onto the surface of the specimen, and thus reaction mechanisms, and the structural changes in the surface of the sample (biological objects, metals) upon the effect of the reaction can be studied in their progress. The applicability of the chamber extends, among other areas, to scanning electron microscopy, emission and reflection electron microscopy and low energy electron diffraction (LEED) methods as well.

What we claim is:

1. A micro-chamber for the electron optical examination of liquids or wet specimens, comprising a casing having at least one small bore for the passage therethrough of an electron optical beam in alignment with said at least one small bore, a holder within the casing for a liquid or specimen wet with a liquid, a pressure-balancing buffer system to retard evaporation of the specimen by supplying vapor to the interior of the chamber, the chamber being closed to the escape of said vapor from the chamber other than through said at least one small bore, cooling means at least partially surrounding the casing for condensing vapors that escape from the chamber, there being two said bores, and a closing element arranged over at least one of said bores.

2. A micro-chamber for the electron optical examination of liquids or wet specimens, comprising a casing having at least one small bore for the passage therethrough of an electron optical beam in alignment with said at least one small bore, a holder within the casing for a liquid or specimen wet with a liquid, a pressure-balancing buffer system to retard evaportion of the specimens by supplying vapor to the interior of the chamber, the chamber being closed to the escape of said vapor from the chamber other than through said at least one small bore, cooling means at least partially surrounding the casing for condensing vapors that escape from the chamber, and a temperature regulator for controlling the temperature of the sample.

3. A micro-chamber for the electron optical examination of liquids or wet specimens, comprising a casing having at least one small bore for the passage therethrough of an electron optical beam in alignment with said at least one small bore, a holder within the casing for a liquid or specimen wet with a liquid, a pressure-balancing buffer system to retard evaporation of the specimen by supplying vapor to the interior of the chamber, the chamber being closed to the escape of said vapor from the chamber other than through said at least one small bore, cooling means at least partially surrounding the casing for condensing vapors that escape from the chamber, and a tubing for introducing the object to be examined, and a smearing unit having a wiper disposed within the chamber.

4. A chamber as claimed in claim 3, and means for introducing a reagent onto the chamber.

* * * * *